United States Patent [19]
Lee

[11] Patent Number: 6,015,996
[45] Date of Patent: Jan. 18, 2000

[54] CELL STRUCTURE OF AN IMPROVED CMOS STATIC RAM AND ITS FABRICATION METHOD

[75] Inventor: Chan-Jo Lee, Seoul, Rep. of Korea

[73] Assignee: Samsung Electronics Co., Ltd., Suwon, Rep. of Korea

[21] Appl. No.: 08/906,433

[22] Filed: Aug. 5, 1997

[30] Foreign Application Priority Data

Aug. 5, 1996 [KR] Rep. of Korea ....................... 96-32651
Jul. 12, 1997 [KR] Rep. of Korea ....................... 97-32492

[51] Int. Cl.[7] ............................ H01L 29/76; H01L 29/94; H01L 23/48; H01L 27/11
[52] U.S. Cl. ........................... 257/393; 257/383; 257/384; 257/754; 257/903
[58] Field of Search .................................. 257/393, 384, 257/754, 903, 369, 382, 383

Primary Examiner—Steven H. Loke
Attorney, Agent, or Firm—Jones Volentine, L.L.P.

[57] ABSTRACT

A static RAM which is a CMOS static RAM having first and second load transistors, first and second driver transistors, and first and second switching transistors in one memory cell includes: a laminated structure of a first polysilicon layer, a silicide layer and a second polysilicon layer, forming the gate regions of the second load and driver transistors in a body; an interconnection layer comprising a laminated structure of the silicide layer and the second polysilicon layer to form a p-n junction between the drain regions of the first load and driver transistors; and one contact for making the gate regions and the interconnection layer in a body by the second polysilicon layer.

5 Claims, 12 Drawing Sheets

CELL STRUCTURE OF AN IMPROVED CMOS STATIC RAM AND ITS FABRICATION METHOD

BACKGROUND OF THE INVENTION

The present invention relates a static semiconductor memory device and. More particularly, the present invention to the cell structure of an improved CMOS static RAM and its fabrication method.

In general, a static random access memory (RAM) is widely used as a cache memory for computers or as a system memory for terminal equipment. Recently static RAMs that can be operated at high speed with low power consumption have been produced using large-scaled integration.

A static RAM that has a memory cell array comprising bistable flip-flop circuits is interior to a dynamic RAM in the integration of cells but it requires no periodic refresh operation, as needed in the dynamic RAM. Thus a static RAM does not employ refresh-related circuits. To accomplish low power consumption and large-scaled integration, a static RAM cell whose devices are all complementary metal-oxide-semiconductor (CMOS) transistors must use six MOS electric field effect transistors (FETs). One memory cell from the memory cell array comprises two driver transistors, two load transistors, and two switching transistors. Transistors of the same function are symmetrical to each other in terms of circuitry. The structure and function of a six transistor static memory cell is introduced in the second edition of the book "Semiconductor Memories" by B. Prince (pages 34 and 35), the contents of which are herein incorporated by reference.

Figure 1:
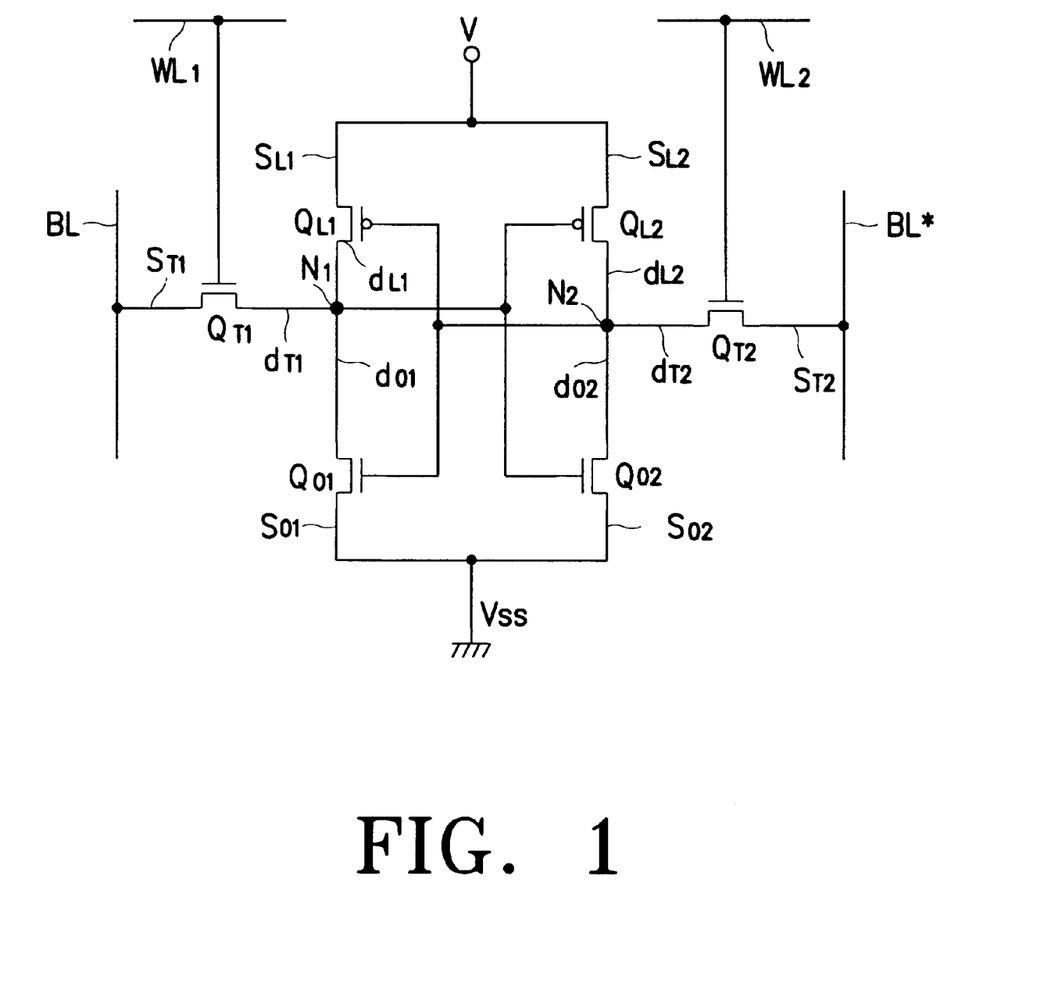
FIG. 1 is a circuit diagram of a full CMOS static RAM comprising six transistors in accordance with a preferred embodiment of the present invention.

FIG. 1 is a typical circuit diagram of a full CMOS static RAM comprising six transistors, first and second switching transistors $Q_{T1}$ and $Q_{T2}$, first and second driver transistors $Q_{D1}$ and $Q_{D2}$, and first and second load transistors $Q_{L1}$ and $Q_{L2}$. The switching transistors $Q_{T1}$ and $Q_{T2}$ and the driver transistors $Q_{D1}$ and $Q_{D2}$ are n-channel MOSFETs, the load transistors $Q_{L1}$ and $Q_{L2}$ are p-channel MOSFETs. The static RAM cell is positioned at the intersection of the sets of complementary bit lines BL and BL* and word lines $WL_1$, and $WL_2$.

As shown in FIG. 1, the first and second switching transistors $Q_{T1}$ and $Q_{T2}$ connect the bit lines BL and BL* with the word lines $WL_1$, and $WL_2$. The source regions $s_{T1}$ and $s_{T2}$ of the first and second switching transistors $Q_{T1}$ and $Q_{T2}$ are respectively connected to the bitlines BL and BL*. The source regions $s_{D1}$ and $s_{D2}$ of the first and second driver transistors $Q_{D1}$ and $Q_{D2}$ are both connected to a ground wiring $V_{ss}$. The source regions $s_{L1}$, and $s_{L2}$ of the first and second load transistors $Q_{L1}$ and $Q_{L2}$ are connected to a power supply wiring $V_{cc}$. The drain regions $d_{L1}$, $d_{D1}$, and $d_{T1}$, of the first load transistor $Q_{L1}$, the first driver transistor $Q_{D1}$ and the first switching transistor $Q_{T1}$, respectively are connected together at a first node $N_1$. The first node $N_1$ is in turn connected to the gates of the second load transistor $Q_{L2}$, and the second driver transistor $Q_{D2}$. The drain regions $d_{L2}$, $d_{D2}$ and $d_{T2}$, of the second load transistor $Q_{L2}$, the second driver transistor $Q_{D2}$ and the second switching transistor $Q_{T2}$, respectively are connected together at a second node $N_2$. The second node $N_2$ is in turn connected to the gates of the first load transistor $Q_{L1}$ and the first driver transistor $Q_{D1}$.

The static RAM cell shown in FIG. 1 is undesirably large in size compared with a one-transistor dynamic RAM cell. In addition, the six-transistor static RAM cell has limitations in its fabrication and packing density because it must have interconnection layers between n-channel and p-channel transistors and gate connection layers for cross-couplings. These interconnection layers exist in the first and second nodes $N_1$ and $N_2$, in FIG. 1. For instance, the node $N_1$ is connected to the drain regions $d_{L1}$, $d_{D1}$ and $d_{T1}$. While the drain region $d_{L1}$ is a p⁺active region heavily doped with p-type ions, the drain region $d_{D1}$, is an n⁺active region.

In a method of fabricating a typical full CMOS memory cell, the isolation between a first n⁺active region ($r_1$) and a second n⁺active region ($r_2$) is made by a field oxide region in a substrate and connected to the gates that are opposite to each other by a separate conductive layer on the substrate. The conductive layer is an interconnection layer that is essential informing the first and second nodes $N_1$, and $N_2$. To provide complete nodes $N_1$ and $N_2$, it is necessary to connect the interconnection layer by the gates that are opposite to each other, in an additional process for forming a gate connection layer (cross-couplings).

A method of forming cross-couplings to solve these problems with the static RAM, cell such as difficulty in its fabrication and filling density, is disclosed in U.S. Pat. No. 4,740,479 under the title of "Method for the manufacture of cross-couplings between n-channel and p-channel CMOS field effect transistors of static write-read memories." In the disclosed method, a gate level comprising double polyside layers is used as an additional wiring level for forming the cross-couplings. To manufacture the cross-couplings, a field oxide layer is deposited by a known LOCOS method to defined an active region. After the gate oxide layer on the active region is photo-etched to open a buried contact, a double-layered structure of a polysilicon layer and a metal salicide layer is deposited and patterned to structure the gate electrode and cross-couplings shown in FIG. 1. As shown in FIG. 1, the gate of the second driver transistor $Q_{D2}$ is connected to the drain region $d_{L1}$ of the first load transistor $Q_{L1}$ through the buried contact. The gate of the first driver transistor $Q_{D1}$ is connected to the drain region $d_{L2}$ of the second load transistor $Q_{L2}$, through another buried contact.

In the above method, it is difficult to reduce the size of cell because each of the nodes $N_1$, and $N_2$ forms a connection through one contact. For example, when the gate of the second driver transistor $Q_{D2}$ is connected to the drain region $d_{L1}$ of the first load transistor $Q_{L1}$ through one buried contact, the drain region $d_{D1}$ of the first driver transistor $Q_{D1}$ must be connected to the gate of the second driver transistor $Q_{D2}$ through another buried contact.

Five buried contacts are thus required to form a complete connection between the nodes $N_1$, and $N_2$ in each cell, and this is a main factor for limiting the margin of design pattern. Furthermore, the integration of cells is hard to realize because a bird's beak of a field oxide layer occurs during the LOCOS process performed to separate the transistor devices.

In the prior art as described above, it must be noted that a double-layered structure of the polysilicon layer and the metal salicide layer are formed after photo-etching the gate oxide layer to open the buried contact. The interfacial characteristic between the gate oxide layer and the polysilicon layer deteriorates due to the particles and other contaminants produced during the etching process of the buried contact. Impurity ions are implanted to form source and drain regions accompanied by a diffusion (drive-in) process after an undoped polyside layer is deposited. Thus the resistance of the buried contact may be increased.

In the drive-in processing stage, the ions contained in tantalum salicide in the polyside layer are driven through the polysilicon layer across to the active region in the substrate having a buried contact. Since the polysilicon layer on the active region contains no impurity ions implanted, a part of the ions in the tantalum salicide remain in the polysilicon layer and only the rest ions are driven to the active region having the buried contact formed on it. Such an incomplete diffusion of impurity ions increases the resistance of the buried contact on the active region. The inferior interfacial characteristic and increased resistance in the contact result in the limitations of the static RAM cell's operation of high speed and low power consumption.

SUMMARY OF THE INVENTION

An objective of the present invention is to provide a static RAM having memory cells of large-scaled integration, and its fabricating method.

Another objective of the present invention is to provide a CMOS static RAM cell and its fabricating method by which the number of contacts can be drastically reduced.

Further another objective of the present invention is to provide a method of fabricating a CMOS static RAM cell whose size can be reduced by decreasing the size of isolation region between the cell transistor devices.

Further another objective of the present invention is to provide a method of fabricating a static RAM cell in which the interfacial characteristic between the gate oxide layer and the polysilicon layer can be improved.

Further another objective of the present invention is to provide a CMOS static RAM cell and its fabricating method by which the contact resistance in the memory cell can be reduced.

Further another objective of the present invention is to provide a method of fabricating a static RAM cell which is more suitable to an operation of high speed and low power consumption.

Further another objective of the present invention is to provide a method of fabricating a static RAM cell consisting of simplified procedures.

Further another objective of the present invention is to provide a method of fabricating a static RAM cell whose contact resistance is reduced and the reliability of process can be secured.

Still further another objective of the present invention is to provide a method of fabricating a static memory cell by which gate and interconnection layers are formed in a body through one contact.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and in which.

DETAILED DESCRIPTION OF THE PREFERRED EMBODIMENT OF THE PRESENT INVENTION

Figure 2:
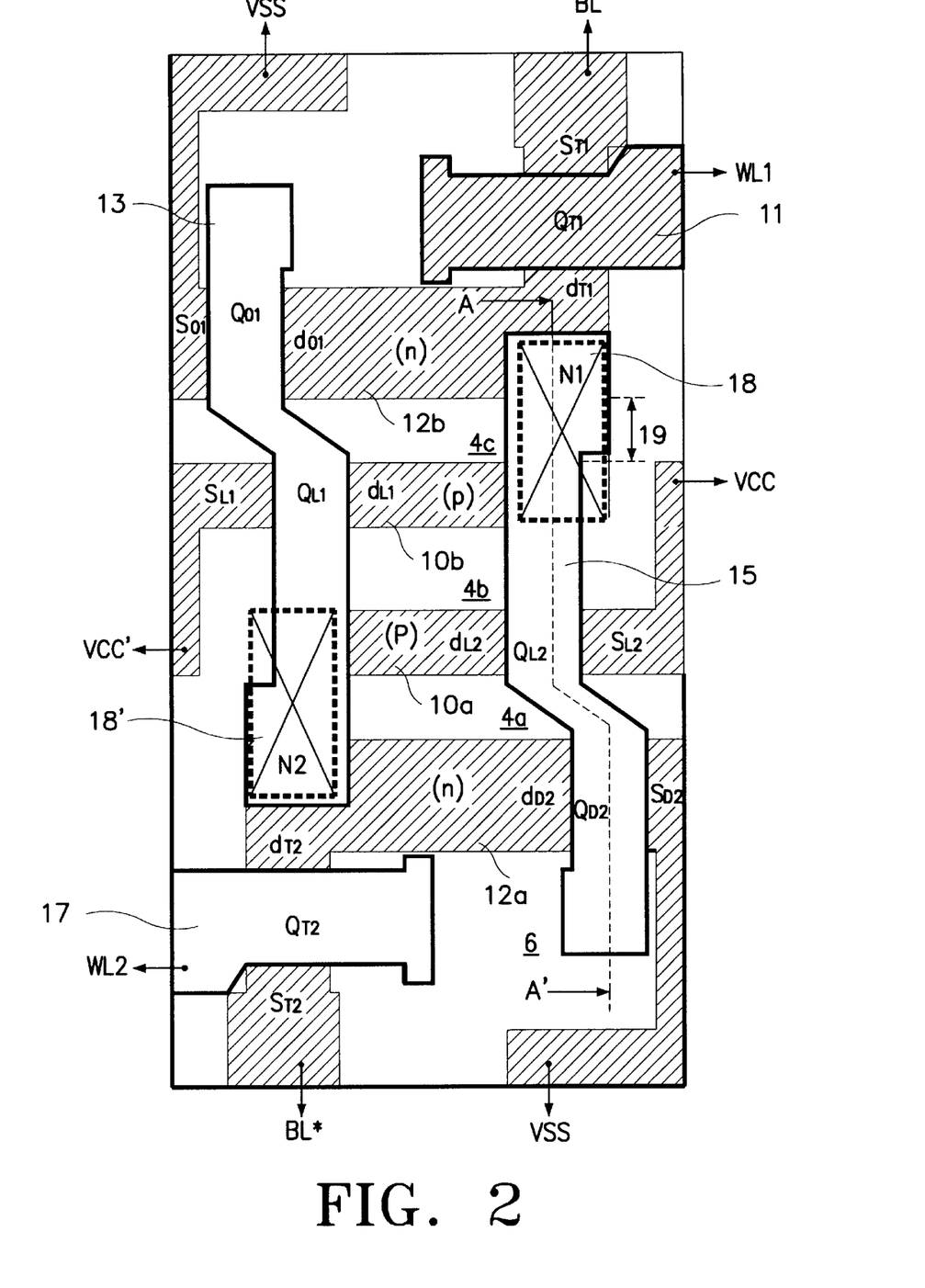
FIG. 2 is a final plan view of a static RAM cell in accordance with the preferred embodiment of the present invention.

FIG. 2 is a final plan view of a static RAM cell in accordance with a preferred embodiment of the present invention. The full CMOS static RAM circuit of FIG. 2 comprises six transistors with the same designations and connections shown in the circuit diagram in FIG. 1.

As shown in FIG. 2, a first polysilicon layer 11 functions as the gate of a first switching transistor $Q_{T1}$, in FIG. 1. A second polysilicon layer 13 functions as the gates of a first driver transistor $Q_{D1}$ and a first load transistor $Q_{L1}$. The second polysilicon layer 13 also forms a node $N_2$ in FIG. 1 through a contact 18'. The second polysilicon layer 13 forms a p-n junction between the drain $d_{L2}$, of a second load transistor $Q_{L2}$ and the drain regions $d_{D2}$ and $d_{T2}$ of n-channel transistors $Q_{D2}$ and $Q_{T2}$ through the contact 18'. This means that the second polysilicon layer 13 functions as an interconnection layer. Similarly, a third polysilicon layer 15 forms a node $N_1$ in FIG. 1 through a contact 18. The third polysilicon layer 15 forms a p-n junction between the drain $d_{L1}$ of the first load transistor $Q_{L1}$ and the drain regions $d_{D1}$, and $d_{T1}$ of n-channel transistors $Q_{D1}$ and $Q_{T1}$ through the contact 18. Thus the third polysilicon layer 15 functions as an interconnection layer. A fourth polysilicon layer 17 functions as the gate of a second switching transistor $Q_{T2}$, in FIG. 1. The first through fourth gate polysilicon layers 11, 13, 15, and 17 are all formed from the same polysilicon layer deposited over the substrate. The second and third gate polysilicon layers 13 and 15 both function as interconnection layers.

As shown in FIG. 2, the hatched areas indicating patterns 10a, 10b, 12a, and 12b become the active regions for the drain, source and channel regions of each transistors. The marginal spaces 4a, 4b, 4c, and 6 are used as field regions to electrically insulate the devices. The features of the present invention will be definitely described by a comparison of FIGS. 1 and 2. Referring to FIG. 2, either one of the nodes $N_1$ and $N_2$ in FIG. 1 can be formed through only one contact. The remaining reference numerals will be explained in the later description of the related drawings. It may be seen that the gate regions of the transistors and the interconnection layers are formed through one contact by the polysilicon layers. More detailed cross-sectional structure is described with reference to FIG. 3.

Figure 3:
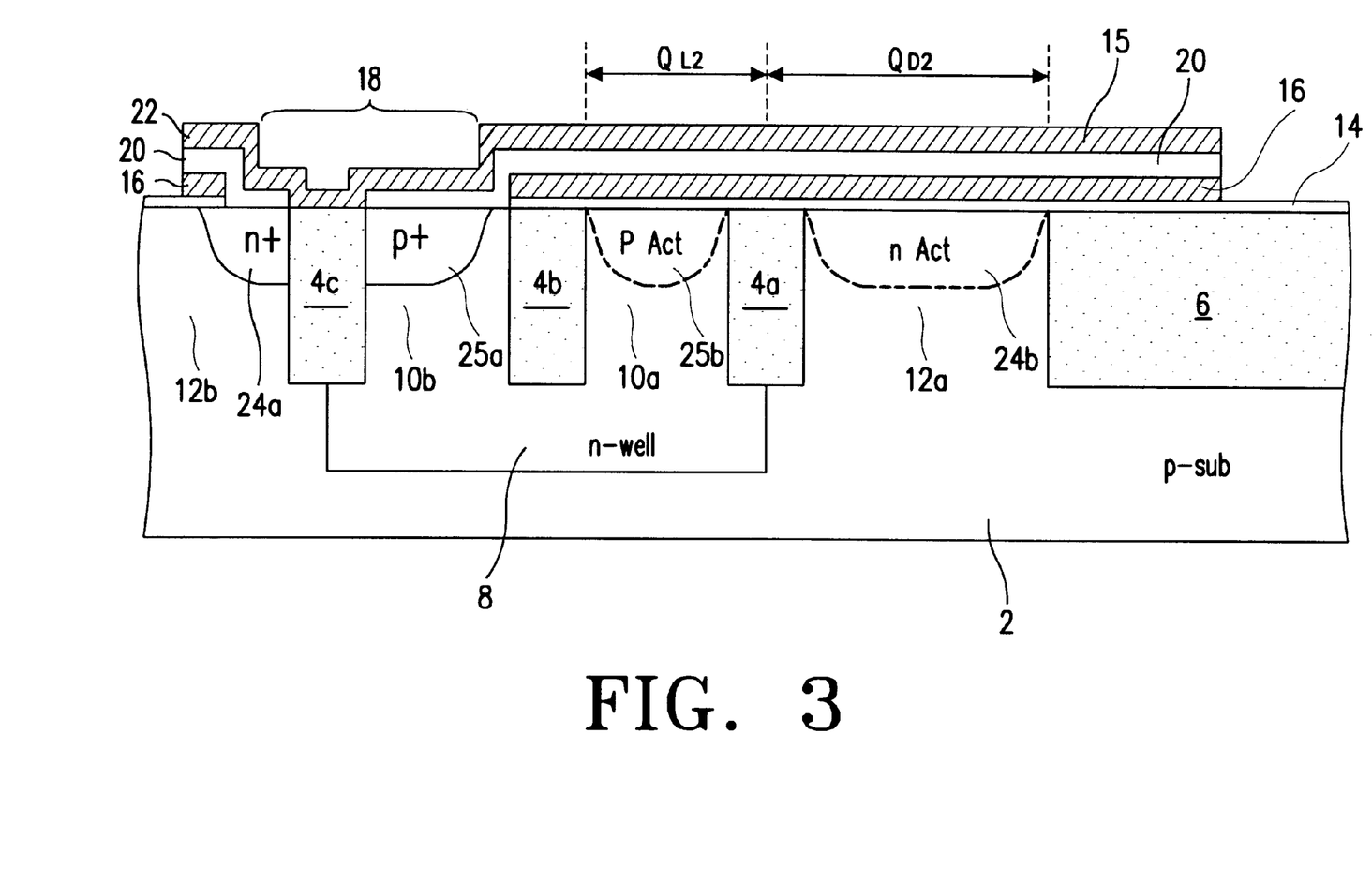
FIG. 3 is a cross-sectional view vertically taken along the line A–A' in FIG. 2.

FIG. 3 is a cross-sectional view vertically taken along the line A–A' in FIG. 2. As shown in FIG. 3, the third polysilicon layer 15 functions as the top gate layers of the second load transistor $Q_{L2}$ and second driver transistor $Q_{D2}$ as well as an interconnection layer formed in the contact 18.

The active regions 12a and 12b exist in a p-type substrate 2, and the regions 10a and 10b are in an n-type well 8. A drain region 24a heavily doped with n-type ions is formed at a predetermined depth in the surface of the active region 12b. This is used as the drain regions $d_{D1}$, and $d_{T1}$ of the first driver transistor $Q_{D1}$ and the first switching transistor $Q_{T1}$. The region 24a will become a common drain region. A drain region 25a heavily doped with p-type ions is formed at a predetermined depth in the surface of the active region 10b. This is used as the drain region $d_{L1}$ of the first load transistor $Q_{L1}$. A trench isolation region 4c is formed between the p-type and n-type regions 24a and 25a to electrically insulate them. The p-n junction is formed by the third polysilicon layer 15 functioning as an interconnection layer. The node $N_1$ is realized by the third polysilicon layer 15 and silicide layer 20 formed in the contact 18. The region 25b on the active region 10a becomes the source or drain region of the second load transistor $Q_{L2}$, a p-type MOS transistor. The region 24b on the active region 12a becomes the source or drain region of the second driver transistor $Q_{D2}$, an n-type MOS transistor. The reference numerals 4a, 4b, 4c and 6 indicate the trench isolation regions.

FIGS. 4 to 14 illustrate the process for manufacturing the static RAM cell shown in FIG. 2. Those drawings will be further understood with reference to FIGS. 15 and 16.

Figure 4:
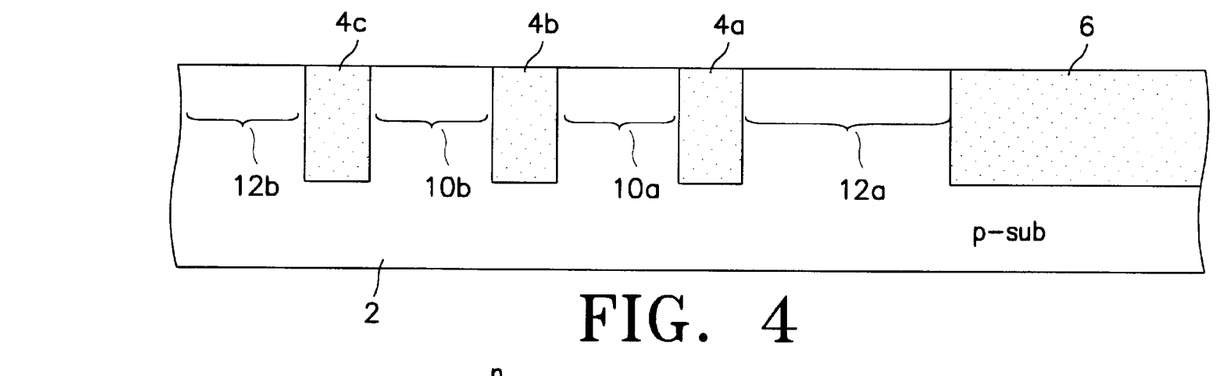
FIGS. 4 to 14 are diagrams illustrating a preferred method of fabricating the static RAM cell shown in FIG. 2.

Referring to FIG. 4, trench isolation regions 4a, 4b, 4c and 6 are formed to electrically isolate the transistors that will be formed on a p-type semiconductor substrate 2. The active regions 10a, 10b, 12a, and 12b are defined to be the transistors. The trench isolation regions are formed in a known manner that the semiconductor substrate 2 is selectively etched as deep as about 0.7 μm to form a predetermined pattern and the etched portions are filled with silicon dioxide. A second load transistor $Q_{L2}$, that is a p-channel MOS transistor will be formed in the active region 10a out of the regions separated by the trench isolation regions. The source region, drain region and p-channel of the second load transistor $Q_{L2}$, are all formed in the active region 10a. The source region, drain region and n-channel of a second driver transistor $Q_{D2}$ that is an n-channel MOS transistor are formed in the active region 12a. The regions of first driver and switching transistors $Q_{D1}$ and $Q_{T1}$ are formed in the active region 12b. In the active region 10b, the region of a first load transistor $Q_{L1}$ is formed. According to the present invention, the transistors are apart from one another at a smaller distance because the devices are isolated by a trench instead of a field oxide layer formed by LOCOS method. This is because a bird's beak of a field oxide layer does not occur in the processing stage for the trench isolation. Therefore, the present invention improves the integration of cell by isolating devices with trenches.

Figure 5:
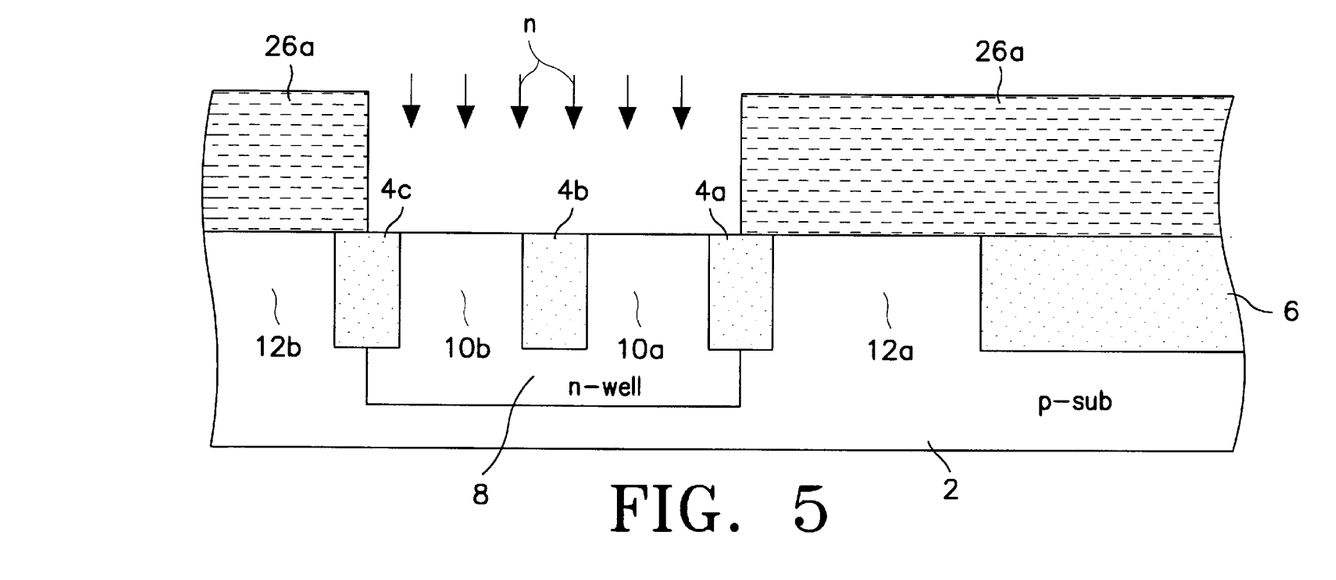

Referring to FIG. 5, an n-type well 8 is formed in the substrate 2. To form the n-type well 8, a part of the surface on trench isolation regions 4a and 4c, the whole surface on the region 6, and the surface of the active regions 12a and 12b are covered with a first photoresist pattern 26a and a known n-type ion implantation is carried out. In this ion implantation, impurity ions consisting of phosphorus are implanted, for example, under the condition of 100 KeV and $1.5 \times 10^{13}/cm^2$. The resulting n-type well region 8 surrounds the active regions 10a and 10b. With the well 8 finished, the pattern 26a is removed to obtain the structure as shown in FIG. 6.

Figure 6:
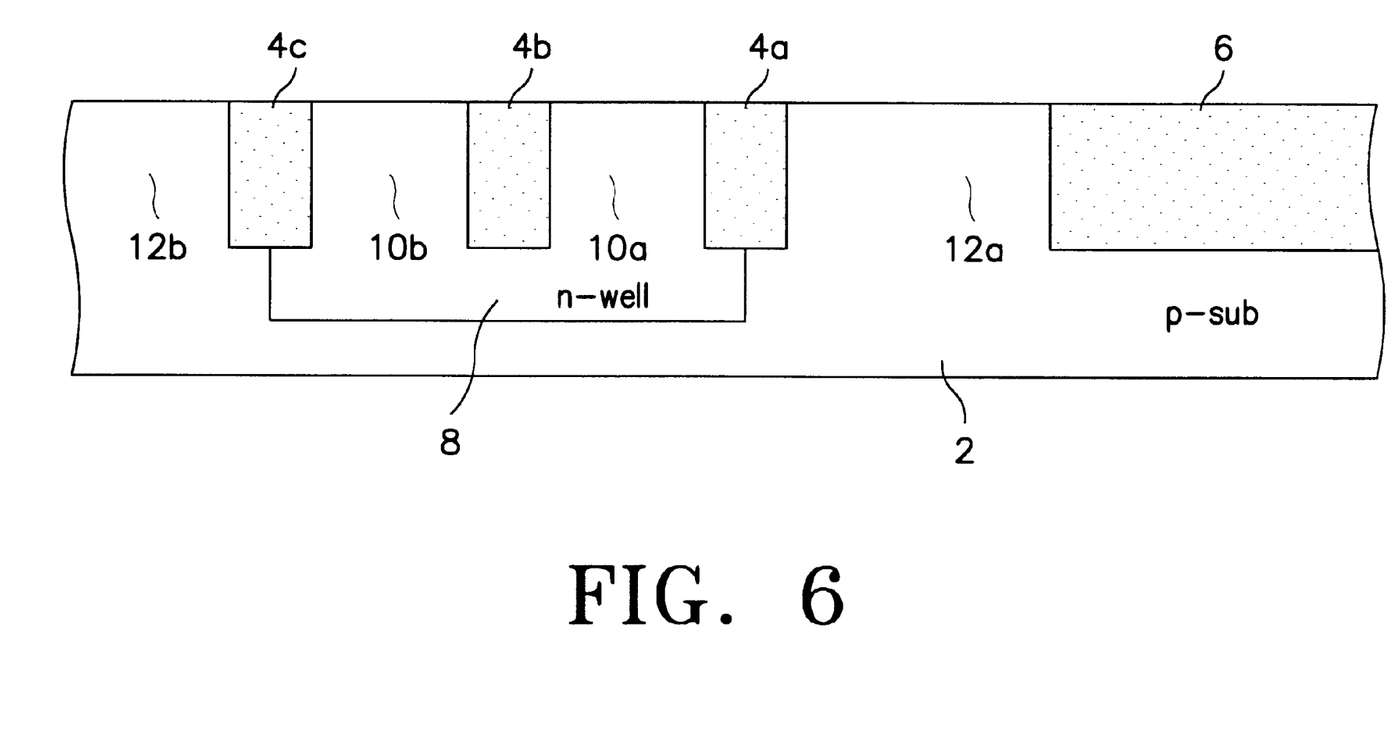

Referring to FIG. 6, the active regions 10a and 10b in the n-type well 8 are used as the regions for the first and second load transistors $Q_{L1}$ and $Q_{L2}$ which are p-channel bulk type load devices. The active regions 12a and 12b in the substrate 2 are used as the regions for the n-channel MOS transistors $Q_{L2}$, and $Q_{D2}$. FIG. 6 will be further understood with reference to FIG. 15.

Figure 15:
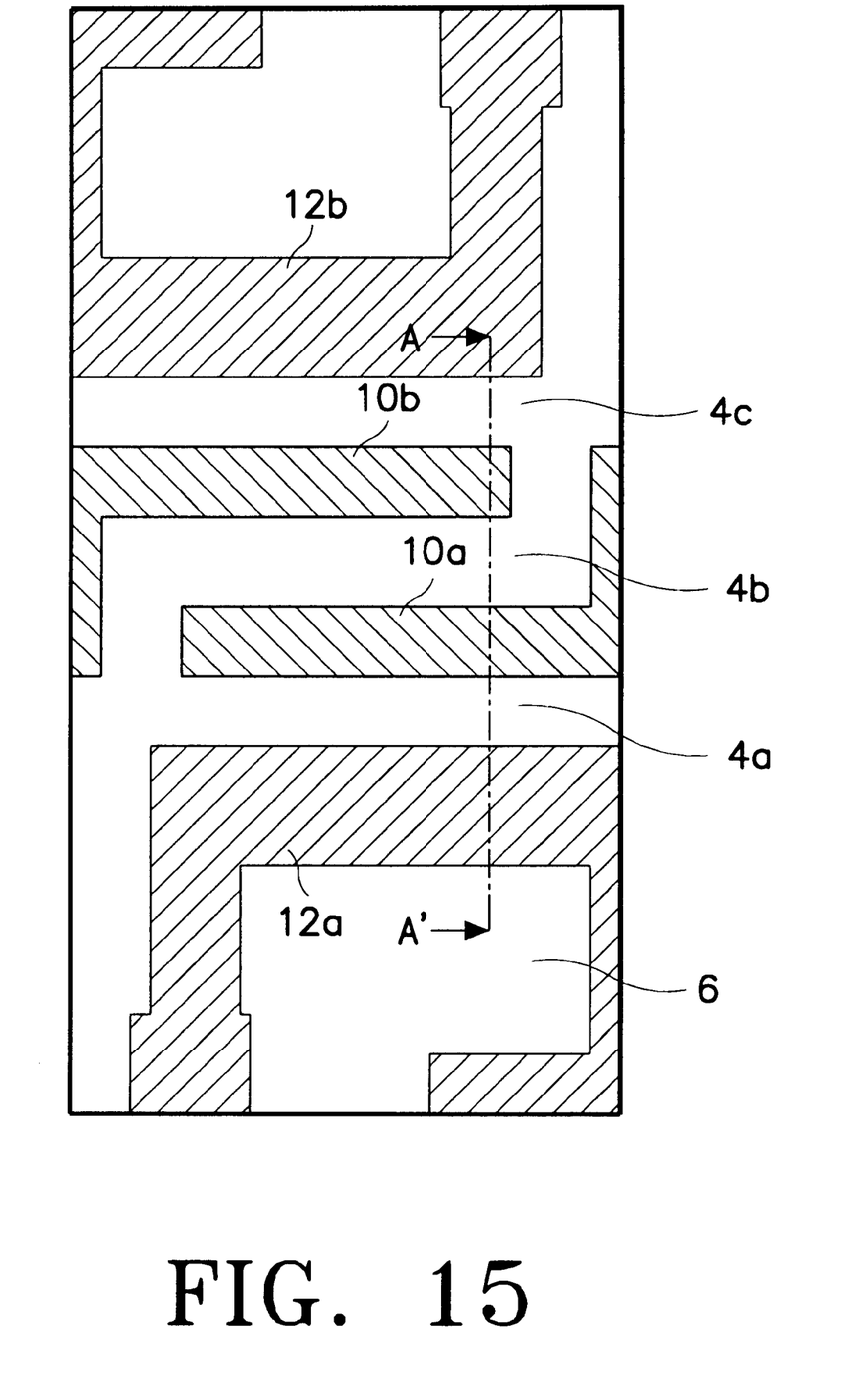
FIG. 15 shows the plane arrangement of the active regions in FIG. 6.

As shown in FIG. 15, the patterns of the active regions 10a, 10b, 12a, and 12b are separated by the isolation regions 4a, 4b, 4c, and 6. The one-directional hatched areas indicate the active patterns 10a and 10b. In the later process, the ions of different conductivity types are implanted across the patterns. FIG. 15 will be further understood with reference to FIG. 2.

Figure 7:
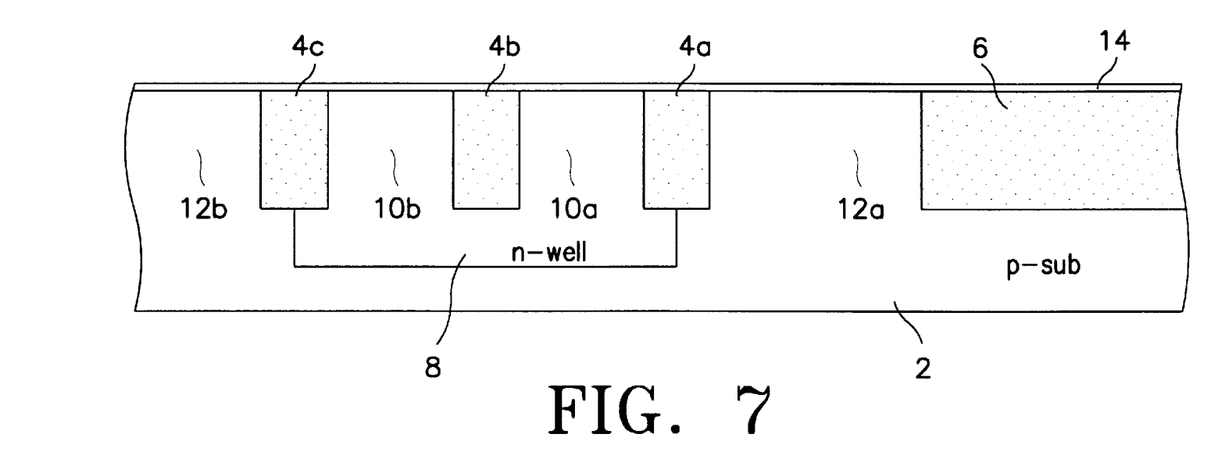
Figure 8:
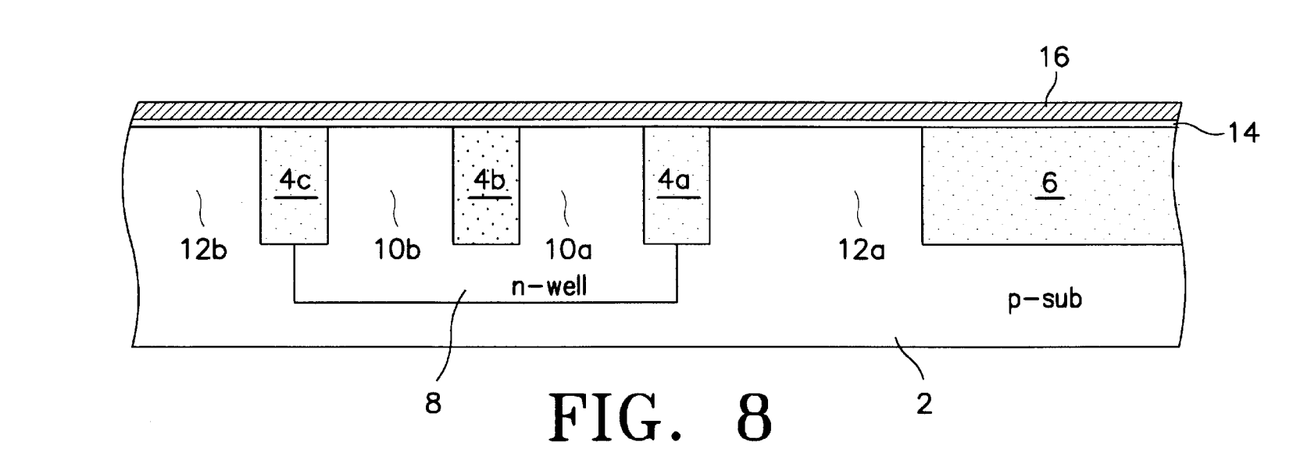
Figure 9:
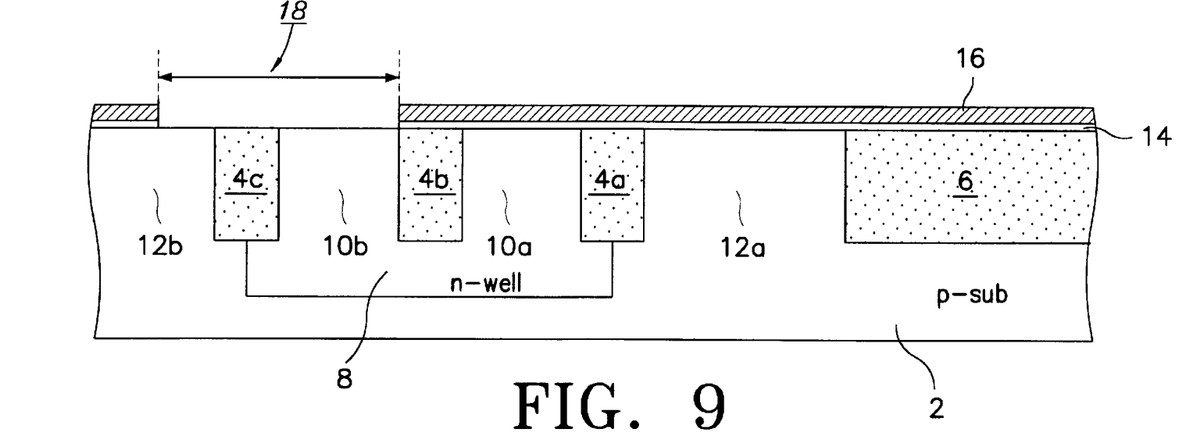

Referring to FIGS. 7 and 8, a lower oxide layer 14 and a lower polysilicon layer 16 are formed over the surface of the structure shown in FIG. 6. Referring to FIG. 9, a contact opening (or contact hole) is formed in the lower oxide layer 14 and the lower polysilicon layer 16. As shown in FIG. 7, the lower oxide layer 14, which will be used as a gate oxide, is preferably formed by a known heat oxidation to a thickness of about 160 Å. As shown in FIG. 8, the lower polysilicon layer 16, which will become a part of the gate, is preferably deposited over the lower oxide layer 14 by a known vapor deposition method. As shown in FIG. 9, a part of the lower polysilicon layer 16 and lower oxide layer 14 are preferably anisotropically etched to form the contact opening 18, which exposes a part of the active regions 10b and 12b. In later processing, the contact opening 18 becomes a buried contact hole. In the preferred embodiment of the present invention, the contact hole is formed after the lower gate polysilicon layer 16 to improve the interfacial characteristic between the gate lower oxide layer 14 and the lower gate polysilicon layer 16.

Figure 16:
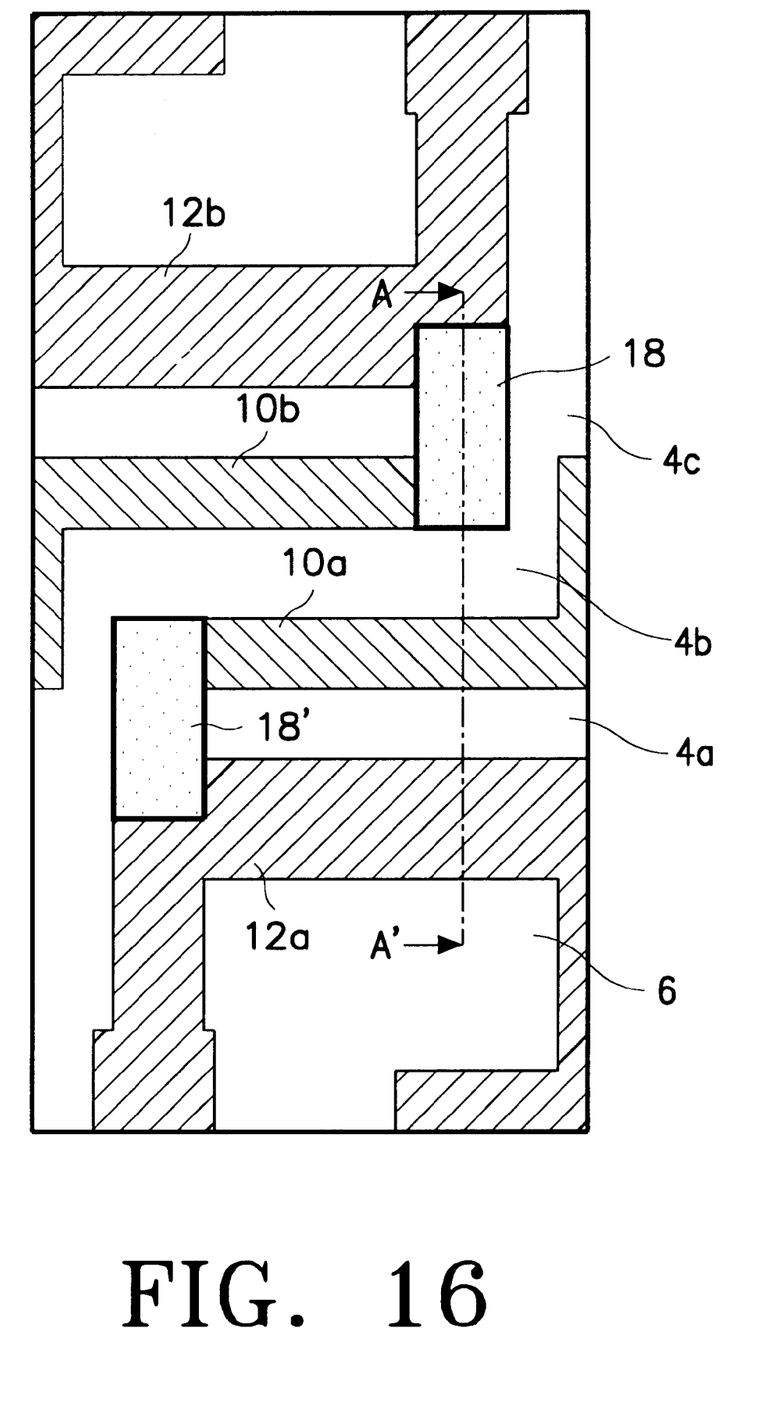
FIG. 16 shows the plane arrangement of the contact openings in FIG. 9.

FIG. 16 shows the position and number of the contact openings 18. The different contact holes 18 and 18' are shown as positioned in a plane. A part of the active region 12b, the trench isolation region 4c, and a part of the active region 10b is exposed through the layers 16 and 14.

Figure 10:
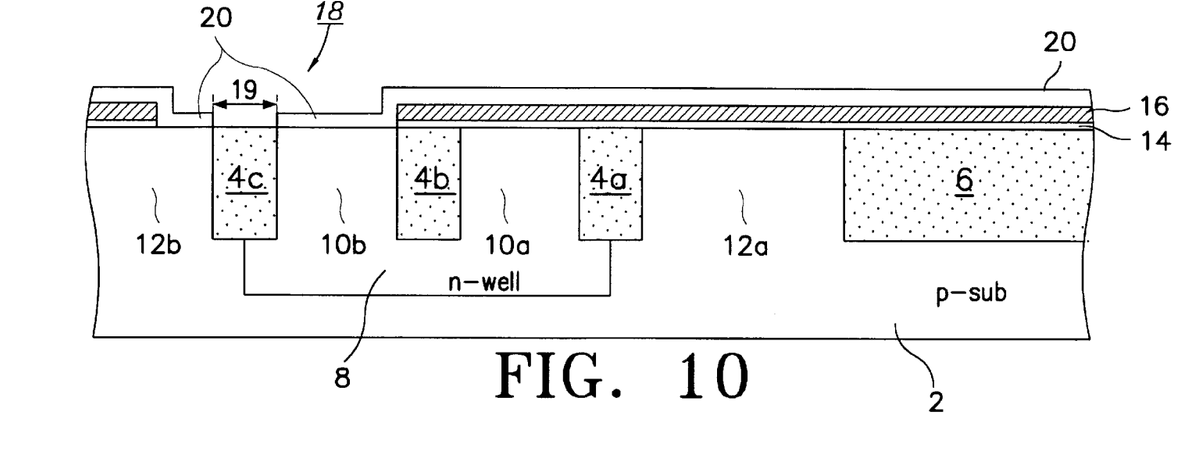
Figure 11:
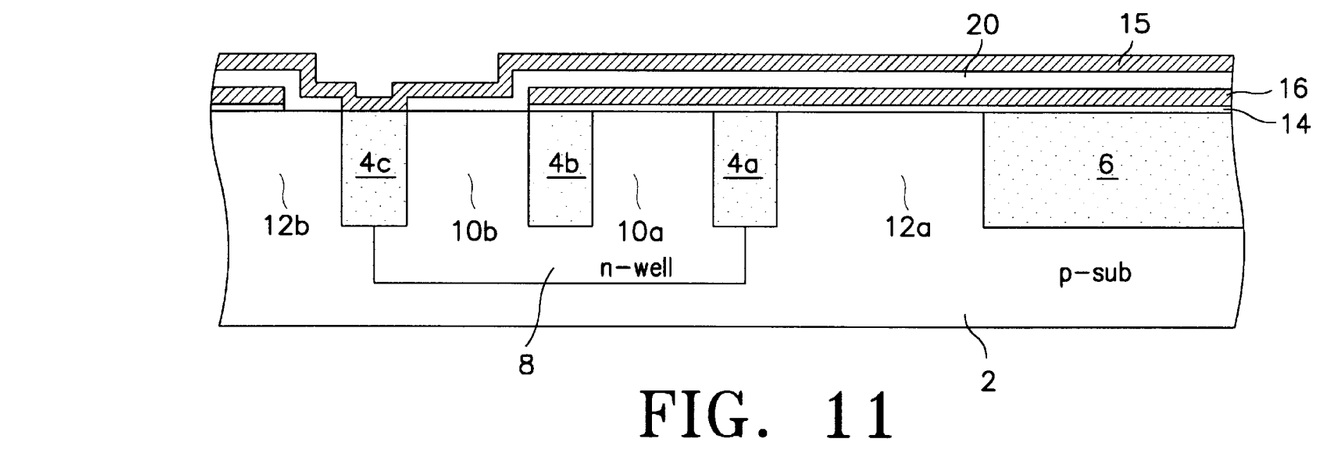
Figure 12:
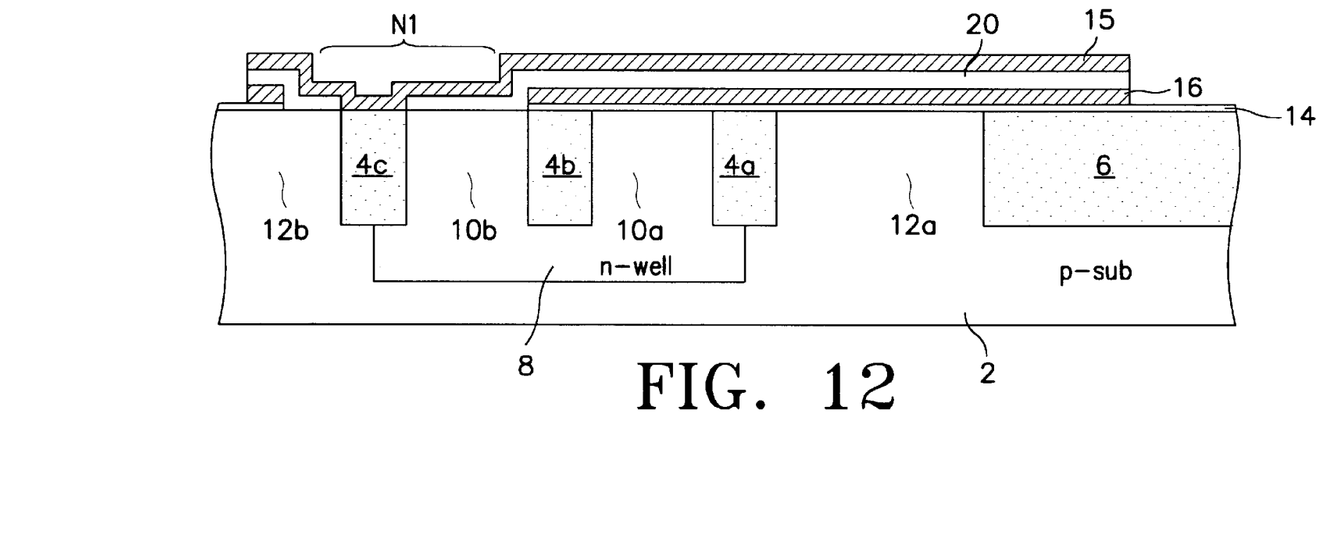

Referring to FIGS. 10, 11, and 12, a salicidation is carried out on the structure of FIG. 9, accompanied by the depositing and patterning of the third polysilicon layer 15.

As shown in FIG. 10, a silicide layer 20 is formed over the whole surface of the lower polysilicon layer 16 and the surface of the active regions 10b and 12b exposed by the contact holes 18 and 18' by a silicidation. To perform the silicidation, a metal layer consisting of Ti, Ta, W or the like is preferably deposited by a known vapor deposition or sputtering method and is treated by a subsequent heat treatment, i.e., annealing. For example, when Ti is used, Ti reacts with silicon ions to form a titanium silicide layer 20. The remaining Ti metals that were not engaged in the formation of metal silicide layer are eliminated by a separate treatment. The reference numeral 19 indicates an oxide layer that is formed by the trench isolation and thus does not produce the silicide layer 20. The opening in the region 19 is formed without using a separate process for forming a contact hole. The silicide layer 20 is used as a part of the gates of the transistors and their connection layer, and functions as an auxiliary layer of the interconnection layer.

Referring to FIG. 11, the third polysilicon layer 15 is then deposited over the whole surface. Since the third polysilicon layer 15 and the lower polysilicon layer 16 are both undoped polysilicon layers, they can be deposited in the same manner.

FIG. 12 shows the polysilicon layers 15 and 16 patterned by a photolithography. In this case, the lower oxide layer 14 is exposed as seen in the left and right sides of the drawing. The gate regions of the second load and driver transistors $Q_{L2}$ and $Q_{D2}$ are formed by a laminated structure of the lower polysilicon layer 16, the silicide layer 20 and the third polysilicon layer 15. The interconnection layer forming a p-n junction between the drain regions of the first load and driver transistors $Q_{L1}$ and $Q_{D1}$ is formed by a laminated layer of the silicide layer 20 and the third polysilicon layer 15. The gate regions and the interconnection layer are formed in a body through one contact 18 by the second polysilicon layer 20. With reference to FIG. 2, it can be found that the third polysilicon layer 15 is patterned into four pieces. Patterning a gate electrode produces an interconnection layer that forms a cross-connection layer and p-n junction between the gate electrode and three common drains the gate electrode. As a result, the node $N_1$ as shown in FIG. 1 is formed at one time. The reference numeral 16 in FIG. 2 indicates a region beneath the third polysilicon layer 15 that includes the lower polysilicon layer 16.

Figure 13:
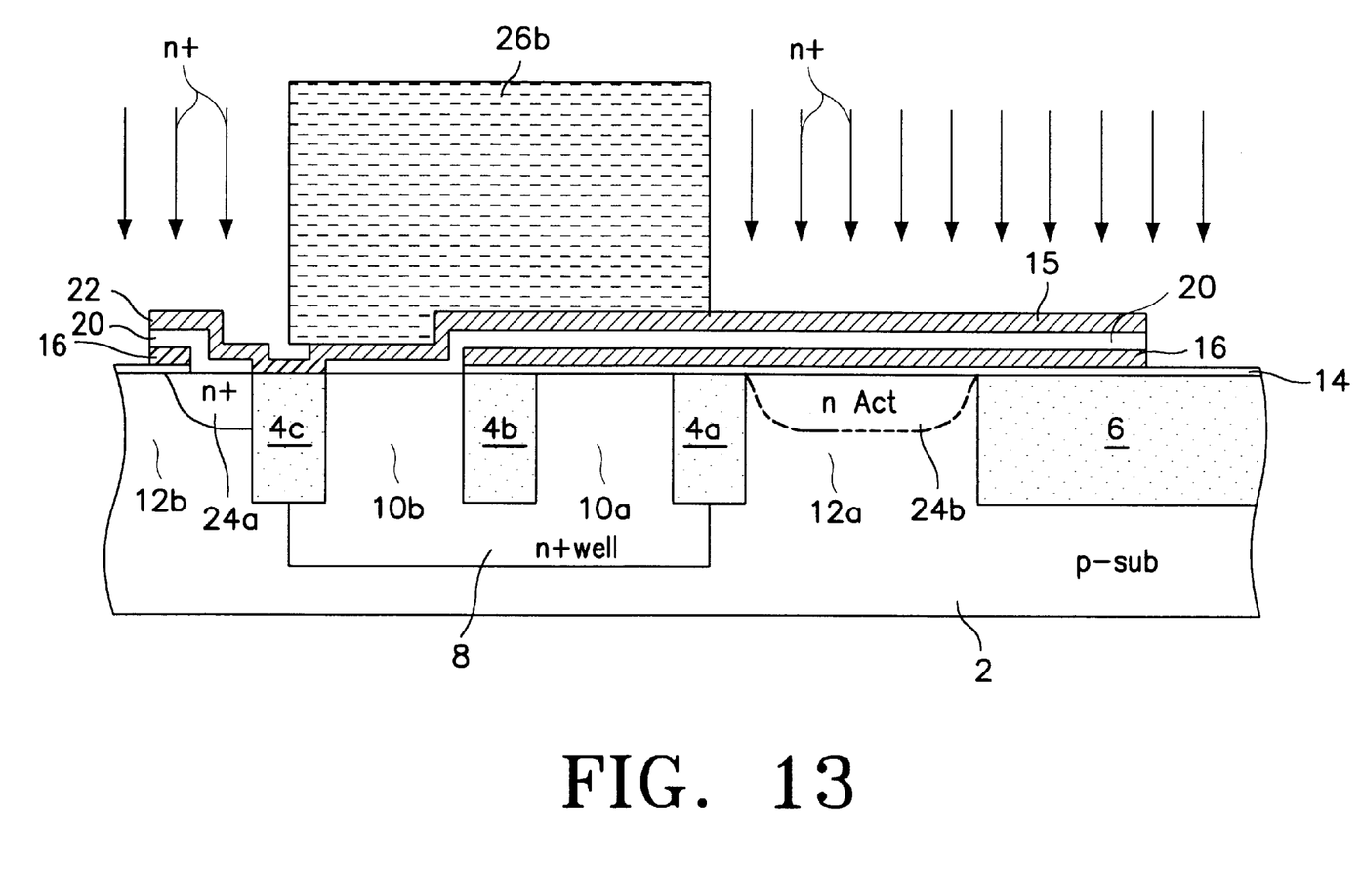
Figure 14:
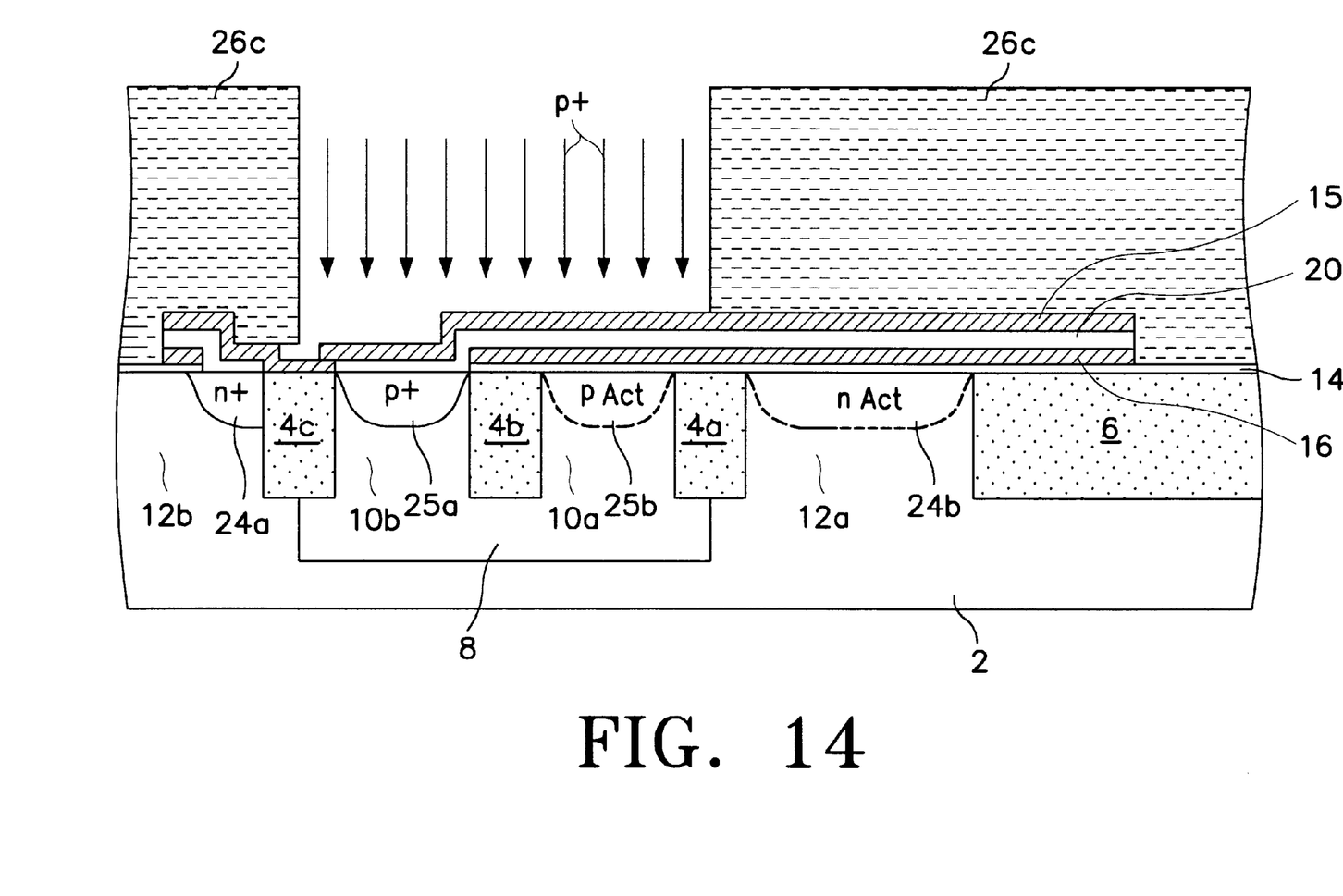

FIGS. 13 and 14 illustrate the process of ion-implantation by which ions of n and p conductivity types are injected to form source and drain junctions.

Referring to FIG. 13, n-type ions (e.g., phosphorus) are heavily implanted (e.g., at a density of $1\times10^{13}/cm^2 \sim 1\times10^{16}/cm^2$) by using a third second photoresist pattern 26b as a mask for the third polysilicon layer 15 located over the p-type well region 8. In this way, the source and drain regions of n-channel MOS transistors are formed. The ions are implanted into the semiconductor substrate 2 through the exposed third polysilicon layer 15. Regions 24a and 24b are formed in the active regions 12a and 12b in the later diffusion processing stage. By the ion-implantation, the silicide layer 20 and the lower polysilicon layer 16 in the contact 18 become n-type layers.

As shown in FIG. 14, the second photoresist pattern 26b is removed, a third photoresist pattern 26c is deposited, and p-type ions (e.g., boron) are heavily implanted (e.g., at a density of $1\times10^{13}/cm^2 \sim 1\times10^{16}/cm^2$) by using the third photoresist pattern 26c as a mask for n-type region. Regions 25a and 25b are formed in the later diffusion processing stage. The p-type ions are also implanted into the silicide layer 20 and the lower polysilicon layer 16 on the exposed layer 15.

After the third photoresist pattern 26c is removed, as shown in FIG. 14, the ions implanted into the semiconductor substrate 2 and n-type well 8 undergo a drive-in (diffusion) process at above 1150° C. for about 8 hours to obtain the result in FIG. 3. The ions are diffused into the respective regions to a predetermined depth adequate for each region. The diffusion regions 24a and 25a formed on the interconnection layer are relatively deep, for the diffusion regions get in contact with the salicide layer 20 of low resistance and only one polysilicon layer exists in the contact 18. Therefore, the concentration of the contact region is significantly higher than that of a conventional buried contact region. This results in a drastic decrease of contact resistance and an enhancement of conductivity. A metallization will be performed by a known method in the next stage.

As described above, after the third polysilicon layer 15 is formed, a part of the third polysilicon layer 15, the salicide layer 20, and the lower polysilicon layer 16 are patterned to form the gate regions of the transistor and the interconnection layer at one time. It is also noted that the p-n junction between the p-type and n-type source and drain regions and the interconnection layer can be provided simply by performing ion-implantation twice. Since the interconnection layer and the gate electrode of the cell transistor are simultaneously formed on the same layer, it is possible to increase the layout margin and reduce the size of cells for VLSI. A static RAM of the present invention is more suitable to a low power consumption and high speed operation because it is manufactured by contacting the ion-diffusion regions on the interconnection layer with the salicide layer to form a contact of low resistance.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A static RAM, having first and second load transistors, first and second driver transistors, and first and second switching transistors in a memory cell, the static RAM comprising:

a laminated structure forming the gate regions of the second load transistor and the second driver transistor, the laminated structure comprising a first polysilicon layer, a first portion of a silicide layer, and a first portion of a second polysilicon layer; and an interconnection layer connecting the drain regions of the first load transistor and the first driver transistor, the interconnection layer comprising a second portion of the second polysilicon layer and a second portion of the silicide layer.

2. A static RAM as recited in claim 1, wherein the static RAM is a CMOS static RAM.

3. A static RAM cell, as recited in claim 1, wherein the interconnection forms a connection between the drain regions of the first load transistor and the first driver transistor.

4. A static RAM cell, which has first and second p-channel load transistors, first and second n-channel driver transistors, and first and second n-channel switching transistors in one memory cell, the static RAM cell comprising:

a laminated structure comprising a first polysilicon layer, a first portion of a silicide layer, and a first portion of a second polysilicon layer, the laminated structure forming the gate regions of the first load transistor and the first driver transistor; and an interconnection layer comprising a second portion of the silicide layer and a second portion of the second polysilicon layer, the interconnection layer connecting the drain regions of the second load transistor, the second n-channel driver transistor, and the second n-channel switching transistor.

5. A static RAM cell, as recited in claim 3, wherein the interconnection forms a connection between the drain regions of the second load transistor, the second n-channel driver transistor, and the second-channel switching transitor.

* * * * *